(12) United States Patent
Narita et al.

(10) Patent No.: US 6,887,802 B2
(45) Date of Patent: May 3, 2005

(54) METHOD OF MANUFACTURING SEMICONDUCTOR DEVICE AND SEMICONDUCTOR DEVICE

(75) Inventors: Masaki Narita, Yokohama (JP); Koichi Sato, Oita (JP); Tokuhisa Ohiwa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/456,906

(22) Filed: Jun. 9, 2003

(65) Prior Publication Data
US 2004/0017011 A1 Jan. 29, 2004

(30) Foreign Application Priority Data
Jun. 10, 2002 (JP) ........................................ 2002-168472

(51) Int. Cl.[7] .............................................. H01L 21/31
(52) U.S. Cl. .................... 438/781; 438/629; 438/637; 438/638; 438/639; 438/672; 438/675; 438/696; 438/780; 257/774
(58) Field of Search ................................ 438/781, 783, 438/780, 639, 672, 675, 629, 637, 696, FOR 388, FOR 349, FOR 348; 257/774, 783

(56) References Cited
U.S. PATENT DOCUMENTS
5,240,879 A * 8/1993 De Bruin .................... 438/653
6,114,259 A * 9/2000 Sukharev et al. ........... 438/789

FOREIGN PATENT DOCUMENTS
JP 10-284600 10/1998
JP 2002-009149 1/2002

* cited by examiner

Primary Examiner—Nitin Parekh
(74) Attorney, Agent, or Firm—Finnegan, Henderson, Farabow, Garrett & Dunner, L.L.P.

(57) ABSTRACT

A method of manufacturing a semiconductor device includes forming a first low dielectric constant insulating film over a semiconductor substrate, forming a photoresist pattern on the first low dielectric constant insulating film, etching the first low dielectric constant insulating film to form a concave portion therein, using the photoresist pattern, burying a conductive film in the concave portion after the photoresist pattern is removed, removing an altered layer formed on a sidewall of the concave portion of the first low dielectric constant insulating film after the conductive film is buried, the altered layer being formed when the photoresist pattern is removed, and forming a second low dielectric constant insulating film so as to fill a gap of the sidewall of the concave portion therewith, the gap resulting from removing the altered layer.

16 Claims, 7 Drawing Sheets

METHOD OF MANUFACTURING SEMICONDUCTOR DEVICE AND SEMICONDUCTOR DEVICE

CROSS-REFERENCE TO RELATED APPLICATIONS

This application is based upon and claims the benefit of priority from the prior Japanese Patent Application No. 2002-168472, filed Jun. 10, 2002, the entire contents of which are incorporated herein by reference.

BACKGROUND OF THE INVENTION

1. Field of the Invention

The present invention relates to a method of manufacturing a semiconductor device and the semiconductor device, in which a low dielectric constant insulating film is used.

2. Description of the Related Art

With high integration and high speed operation of the semiconductor device, reduction of a capacitance between wirings is strongly required. In order to reduce such a parasitic capacitance, it is absolutely necessary to develop a technique of reducing the resistance of a metal wiring layer and a technique of reducing the dielectric constant of an interlayer insulating film.

Problems associated with the latter technique of reducing the dielectric constant of the interlayer insulating film will be described here. An $SiO_2$ film produced by a plasma CVD process or an FSG (Fluorinated Silicate Glass) film is known as the interlayer insulating film. However, these insulating films have limitation to reduce the dielectric constant from a viewpoint of stability of film quality. Specifically, the dielectric constant (k) can be reduced only up to about 3.3.

In order to reduce the dielectric constant not more than 3.0, the insulating film called a low-k film is investigated. An organic silicon oxide film containing $CH_3$ or a CF series film is known as the low-k film.

However, there is the following problem in such kind of low-k film. FIGS. 4A to 4C are sectional views of processes for illustrating the problems. The problem is generated in a process of removing a photoresist pattern in a damascene process.

In FIG. 4, for example an organic silicon oxide film (low-k film) 82 containing $CH_3$ is formed on a silicon substrate 81 in which a semiconductor element, a Cu wiring layer and the like are provided, and a capping layer 83 is formed thereon. The capping layer 83 is formed by using the insulating film such as, for example, an $SiO_2$ film and an SiN film.

As shown in FIG. 4B, after a photoresist pattern 84 is formed on the cap layer 83, the low-k film 82 is etched to form a wiring groove 85, using the photoresist pattern 84 as a mask.

Thereafter, as shown in FIG. 4C, the photoresist pattern 84 is removed by ashing which adopts oxygen plasma processing.

At this point, an inside wall of the wiring groove 85, which is an exposed surface of the low-k film 82, is altered by oxygen radical in plasma to produce an altered or degenerated layer 86 therein. Specifically, $CH_3$ is drawn from the organic silicon oxide film which is exposed to the inside wall (bottom surface and side surface) of the wiring groove 85, and the inside wall of the wiring groove 85 is altered to a silicon oxide film (altered layer 86). The presence of the altered layer 86 changes a substantial k value of the low-k film 82.

The k value of the usual silicon oxide film is around 4, but the silicon oxide film (altered layer 86), in which the inside wall of the wiring groove 85 is altered, is changed to a porous silicon oxide film, so that the k value of the porous silicon oxide film is lower than that of the usual silicon oxide film.

However, actually since the porous silicon oxide film absorbs moisture, the k value of the low-k film 82 is substantially increased when the altered layer 86 is generated. Consequently, it is difficult to reduce the dielectric constant of the interlayer insulating film.

In order to solve the above-described problem, a method is tried for removing the moisture in the porous silicon oxide film which is the altered film 86. However, the method is not the effective solution, because it is difficult to remove the moisture under the present conditions.

Therefore, the ashing conditions is being reconsidered such that the altered layer 86 of the low-k film 82 becomes minimum, but the altered layer 86 still remains to an extent of about 20 nm, so that it is impossible to restrain the substantial increase in the k value of the low-k film 82. The increase in the k value becomes larger problem, as the fine device structure is advanced and the integration density is increased to narrow a distance between wirings. That is to say, as shown in FIG. 5, when the dielectric constant of the altered layer 86 becomes larger and the distance between wirings is narrowed as small as 0.1 $\mu$m, a parasitic capacitance C between adjacent conductors 87 is not negligible.

BRIEF SUMMARY OF THE INVENTION

According to a first aspect of the present invention, there is provided a method of manufacturing a semiconductor device, comprising:

forming a first low dielectric constant insulating film over a semiconductor substrate;

forming a photoresist pattern on the first low dielectric constant insulating film;

etching the first low dielectric constant insulating film to form a concave portion therein, using the photoresist pattern;

burying a conductive film in the concave portion after the photoresist pattern is removed;

removing an altered layer formed on a sidewall of the concave portion of the first low dielectric constant insulating film after the conductive film is buried, the altered layer being formed when the photoresist pattern is removed; and forming a second low dielectric constant insulating film so as to fill a gap of the sidewall of the concave portion therewith, the gap resulting from removing the altered layer.

According to a second aspect of the present invention, there is provided a method of manufacturing a semiconductor device, comprising:

forming a first low dielectric constant insulating film on a semiconductor substrate;

etching the first low dielectric constant insulating film so as to pass through the first low dielectric constant insulating film to form a first opening having a first opening width therein, using a first photoresist pattern;

removing the first photoresist pattern;

etching the first low dielectric constant insulating film to form a second opening therein, using a second photoresist pattern, the second opening having a second opening width larger than the first opening width and a depth shallower than that of the first opening;

removing the second photoresist pattern;

burying a conductive film in a concave portion in which the first and second openings are communicated with each other;

removing an altered layer formed on a sidewall of the second opening after the conductive film is buried, the altered layer being formed when the second photoresist pattern is removed; and forming a second low dielectric constant insulating film so as to fill a gap of the sidewall of the second opening therewith, the gap resulting from removing the altered layer.

According to a third aspect of the present invention, there is provided a semiconductor device comprising:

a first low dielectric constant insulating film having a concave portion, the first low dielectric constant insulating film being provided over a semiconductor substrate;

a conductive film buried in the concave portion; and a second low dielectric constant insulating film formed to be interposed between a sidewall of the conductive film and the first low dielectric constant insulating film.

DETAILED DESCRIPTION OF THE EMBODIMENTS

Referring to the accompanying drawings, embodiments of the invention will be described below.

FIGS. 1A to 1G are sectional views showing a series of a Cu damascene process according to a first embodiment.

Figure 1A:
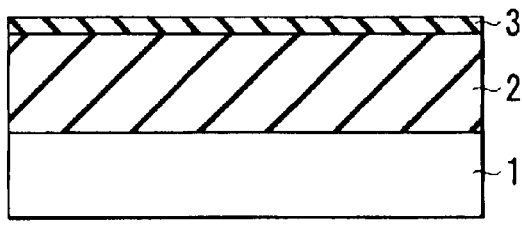
FIGS. 1A to 1G are sectional views showing a series of a damascene process according to a first embodiment.

First, as shown in FIG. 1A, a low-k film 2 is formed by coating or a CVD process on a silicon substrate 1 which includes a semiconductor element and a Cu wiring layer (not shown) and then a modified layer 3 is formed on the low-k film 2.

At this point, an organic silicon oxide film is used as the low-k film 2. Examples of the organic silicon film include polysiloxane, benzocyclobutene (BCB), and the like.

Although the modified layer 3 is produced by subjecting a surface of the low-k film 2 having low mechanical strength to a surface modification processing such as plasma irradiation, $O_2$-RIE, and UV-cure, here the oxygen plasma processing is adopted. This allows the modified layer 3 to be a silicon oxide film having the higher mechanical strength. Even when the film containing Si except the organic silicon oxide film is used as the low-k film 2, the modified layer 3 is the silicon oxide layer.

Figure 1E:
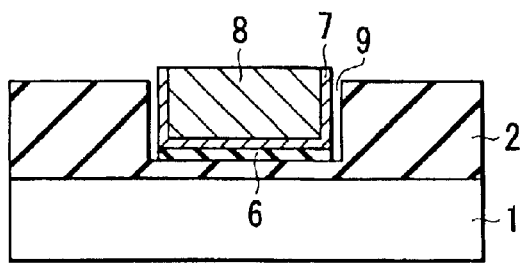
Figure 1B:
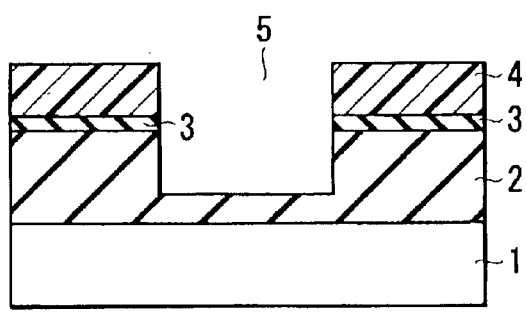

As shown in FIG. 1B, after a photoresist pattern 4 is formed on the modified layer 3, the low-k film 2 is etched by using the photoresist pattern 4 as a mask, thereby providing a wiring groove 5. For example, RIE (Reactive Ion Etching) is used for the etching of the low-k film 2.

Figure 5:
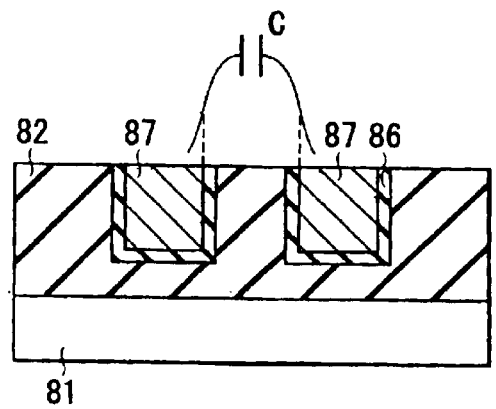
FIG. 5 is a sectional view showing a capacitance between wirings of the prior art.

Though only one wiring groove 5 is shown in the low-k film 2 in FIG. 5, another wiring groove is formed at a distance of, for example, 0.1 μm from the above-described wiring groove 5.

Figure 1F:
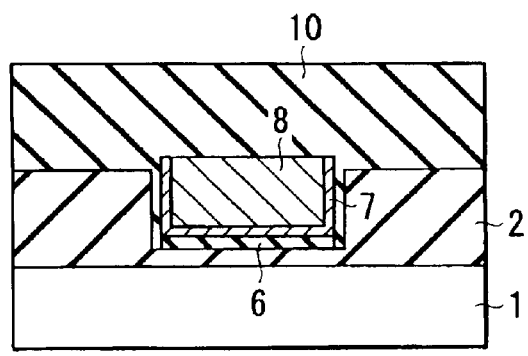
Figure 1C:
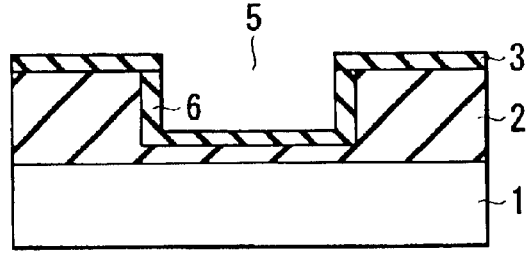

As shown in FIG. 1C, the photoresist pattern 4 is removed by the ashing which adopts the oxygen plasma processing. The ashing is performed by using an RIE type ashing apparatus. At this point, an exposed part of the low-k film 2 is altered by the oxygen radical in the plasma, and an altered layer (silicon oxide film) 6 having the thickness of 20 nm or more is produced on a sidewall and a bottom portion of the wiring groove 5.

Figure 1G:
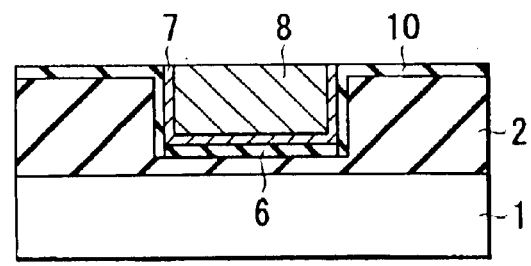
Figure 1D:
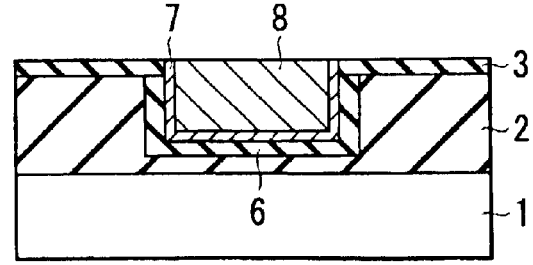

As shown in FIG. 1D, after a barrier metal film 7 of a TaN film (conductive film containing Ta) and a Cu wiring layer 8 of a Cu film are deposited over the substrate surface so as to be buried in the wiring groove 5, unnecessary TaN film and Cu film which are located outside the wiring groove 5 are removed by chemical mechanical polishing (CMP), and the barrier metal film 7 and the Cu wiring layer 8 are buried in the wiring groove 5. At this point, the modified layer 3 having the higher mechanical strength is formed on the upper surface of the low-k film 2, so that the low-k film 2 having the small mechanical strength can be protected from crack occurrence and the like to increase CMP resistance sufficiently.

Then, the altered layer 6 and the modified layer 3, which are the silicon oxide film, are selectively removed by diluted fluoric acid processing (HF wet processing) as shown in FIG. 1E. That is, since both the modified layer 3 and the altered layer 6 are of the equal silicon oxide film formed by the surface modification processing for the low-k film 2, the dilute fluoric acid processing can remove a region from the modified layer 3 to the altered layer 6 along the sidewall of the wiring groove 5. In this case, the processing conditions are controlled such that the altered layer 6 remains beneath the barrier metal film 7. The diluted fluoric acid processing is adopted as the wet processing here because the modified layer 3 is the silicon oxide film, however, the wet processing may be properly changed according to the material of the modified layer 3.

As shown in FIG. 1F, a low-k film 10 is deposited over the substrate surface so as to fill a gap 9 of the sidewall of the wiring groove 5 therewith, which is generated by the removal of the altered layer 6. Though the same material as that of the low-k film 2 is usually used as the material of the low-k film 10, the material different from that of the low-k film 2 may be used if necessary.

When the material different from that of the low-k film 2 is used for the low-k film 10, the insulating film in which the wiring layer is buried becomes two substantially different kinds of insulating films except the altered layer 6 remaining in the bottom portion of the wiring layer. Further, the insulating film corresponding to the low-k film 10 is not completely buried in the gap 9 of the sidewall of the wiring groove 5, for example the insulating film corresponding to the low-k film 10 may be formed such that a cavity is formed in the gap 9 of the sidewall of the wiring groove 5.

Finally, as shown in FIG. 1G, the low-k film 10 is polished by CMP until the surface of the Cu wiring layer 8 is exposed, and the Cu damascene process is finished.

According to the embodiment, since the altered layer 6 is removed from the sidewall of the wiring groove 5 in the process of FIG. 1E, the k value of the low-k film 2 is not substantially increased between the wirings where the increase in the parasitic capacitance becomes the largest problem. Accordingly, the capacitance between the wiring layers can be reduced. In addition, the altered layer 6 remaining in the bottom portion of the wiring groove 5 is formed in such a manner that the low-k film 2 is modified by the oxygen plasma processing similar to that in the case of the modified layer 3 of the surface of the low-k film 2 in FIG. 1A. Therefore, it is expected that its structure contributes to improvement of the mechanical strength of the semiconductor device, compared with the structure in which the whole circumferential surfaces of the barrier metal film 7 is surrounded with the low-k films 2 and 10.

A second embodiment which uses the low-k film to form a dual damascene wiring layer will be described below. FIGS. 2A to 2H are sectional views showing steps of forming these wiring layers.

Figure 2A:
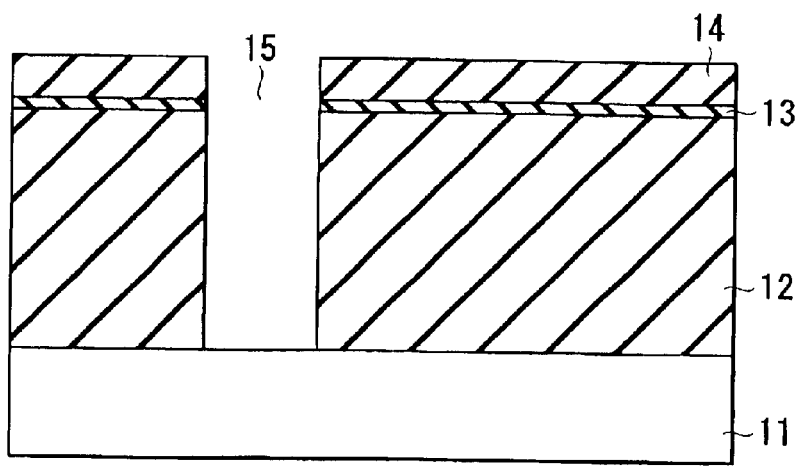
FIGS. 2A to 2H are sectional views showing a series of forming a dual damascene wiring layer according to a second embodiment.

First, as shown in FIG. 2A, a low-k film 12 is formed on a silicon substrate 11 which includes a semiconductor element and a Cu wiring layer (not shown), and then a modified layer 13 is formed on it in the same manner as the first embodiment. After a first photoresist pattern 14 is formed on the modified layer 13, the low-k film 12 is selectively removed by the RIE process so as to pass through the low-k film 12 to produce a first opening 15, using the first photoresist pattern 14 as the mask.

Figure 2B:
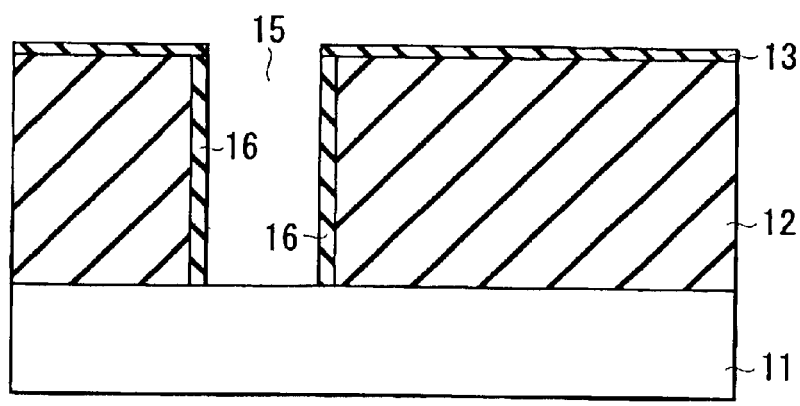

As shown in FIG. 2B, the first photoresist pattern 14 is removed by the ashing using the oxygen plasma processing. In the ashing processing, the exposed part of the low-k film 12 is altered by the oxygen radical in the plasma and an altered layer (silicon oxide film) 16 is formed on the sidewall of the first opening 15.

Figure 2C:
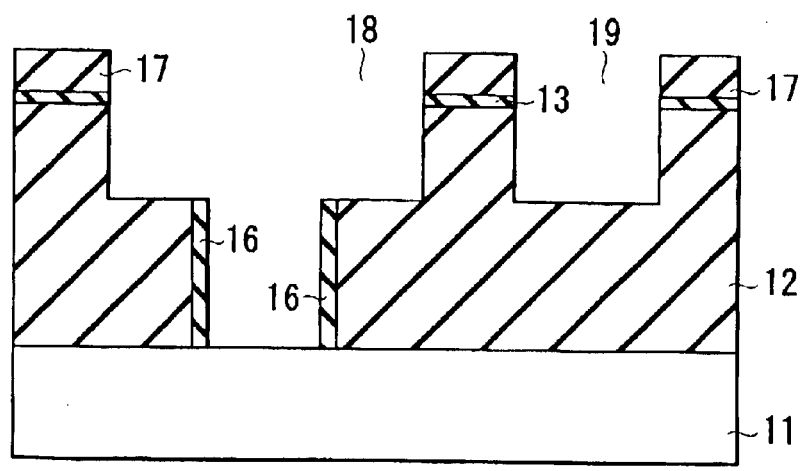

As shown in FIG. 2C, a second photoresist pattern 17 is formed on the residual modified layer 13 and the low-k film 12 is selectively removed partway in the thickness direction. As a result, a second opening 18, which overlaps with the first opening 15 and is larger than a width of the first opening 15, is formed in the low-k film 12. At the same time, a wiring groove 19 for buried wiring layer close to the second opening 18 is formed in the low-k film 12.

Figure 2D:
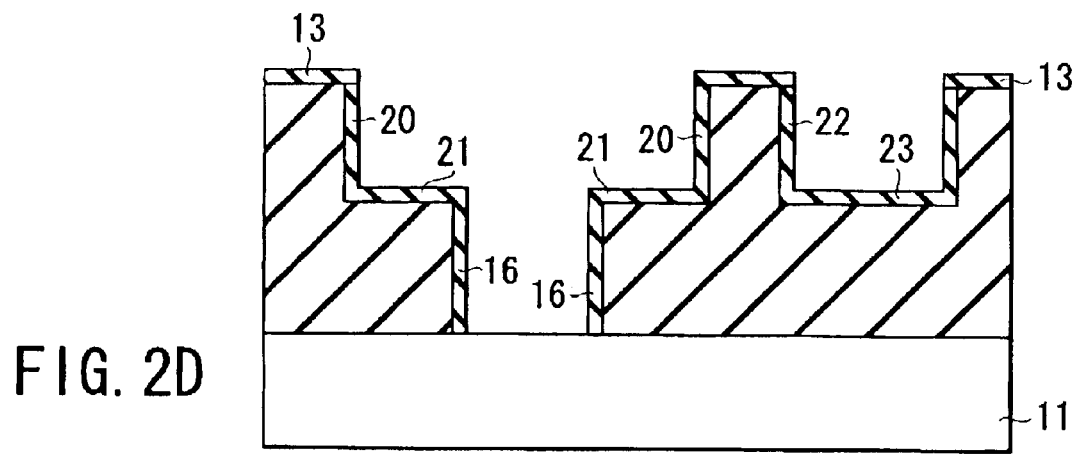

As shown in FIG. 2D, the second photoresist pattern 17 is removed by the same ashing processing. In the ashing processing, the exposed part of the low-k film 12 is altered by the oxygen radical in the plasma and altered layers 20 and 21 are formed on the sidewall and the bottom portion of the second opening 18. Altered layers 22 and 23 are simultaneously formed on the sidewall and the bottom portion of the wiring groove 19.

Figure 2E:
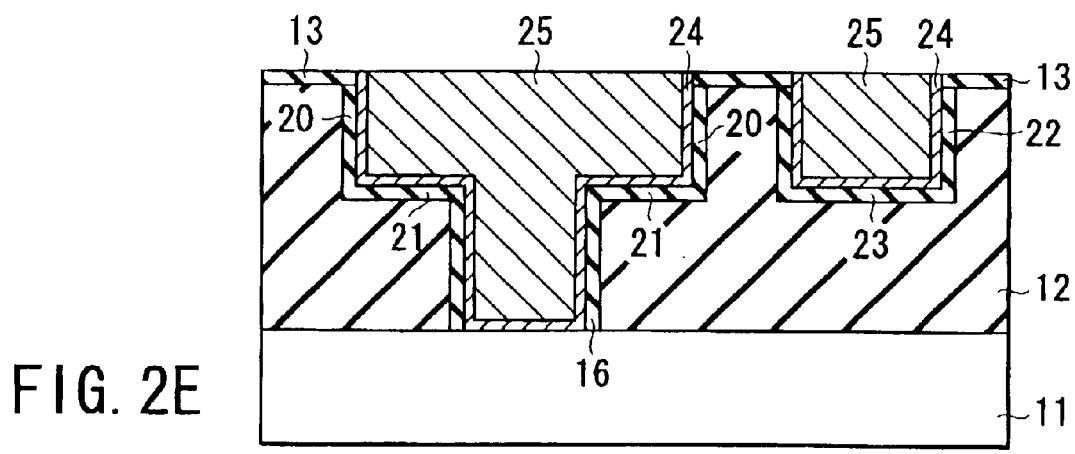

As shown in FIG. 2E, after a TaN film of a barrier metal film 24 and a Cu film of a Cu wiring layer 25 are deposited over the substrate surface so as to be buried in the first and second openings 15 and 18 and the wiring groove 19, the unnecessary TaN film and Cu film which are located outside the openings 15 and 18 and the wiring groove 19 are removed by the CMP process, and the barrier metal film 24 and the Cu wiring layer 25 are buried inside the openings 15 and 18 and the wiring groove 19.

Figure 2F:
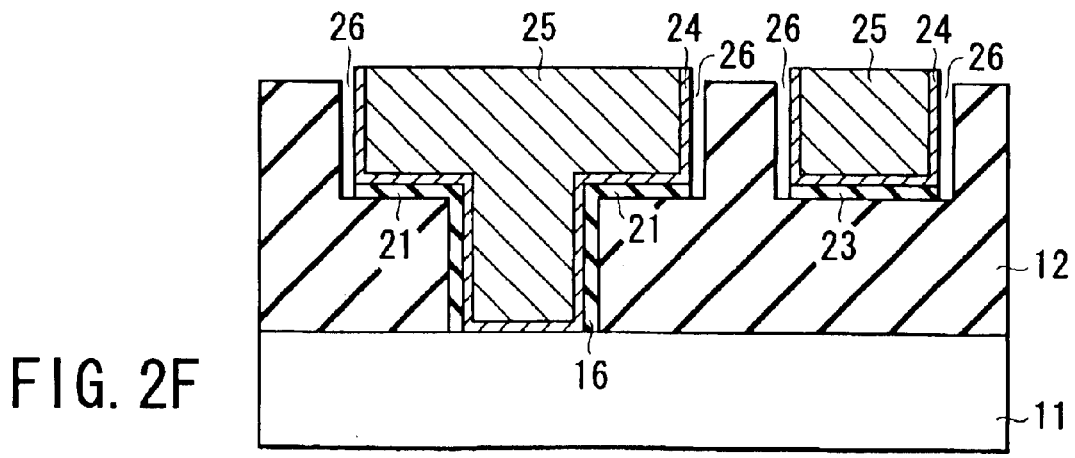

As shown in FIG. 2F, the exposed modified layer 13 and altered layers 20 and 22, which are the silicon oxide film, are selectively removed by the wet processing to form a gap 26 between the upper portion of the barrier metal film 24 and the low-k film 12. That is, the modified layer 13 and the altered layer 20 along the sidewall of the second opening 18 are removed by the wet processing. At the same time, the altered layer 22 is removed along the sidewall of the wiring groove 19. In this case, the processing conditions are controlled such that the altered layers 16 and 21 of the openings 15 and 18 and the altered layer 23 of the wiring groove 19 remain in the lower portion of the barrier metal film 24.

Figure 2G:
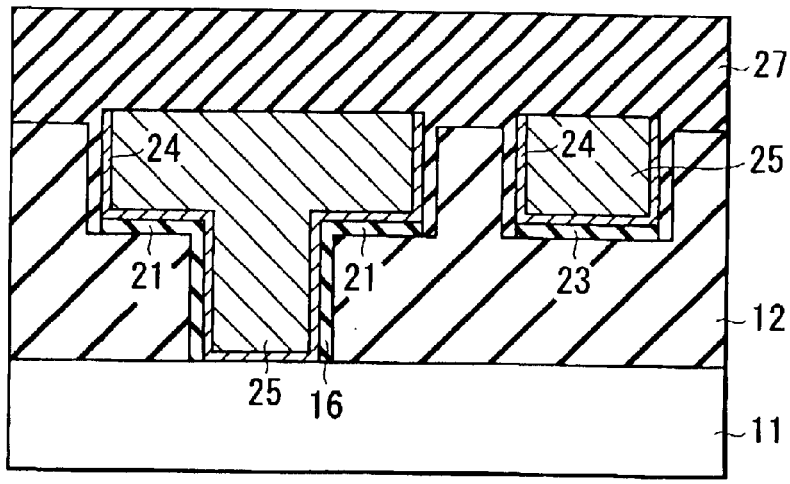
Figure 2H:
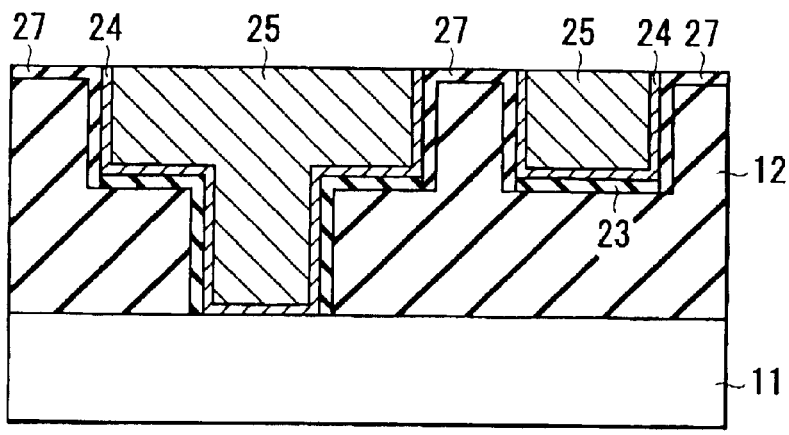

As shown in FIG. 2G, a low-k film 27 is deposited over the substrate surface so as to be buried in the gap 26 of the sidewalls in the opening 18 and the wiring groove 19. The same material as that of the low-k film 12 is used as the material of the low-k film 27.

Finally, as shown in 2H, the low-k film 27 is polished by the CMP process until the surface of the Cu wiring layer 25 is exposed, and the Cu damascene process is finished.

Even in the second embodiment, similarly to the first embodiment, the altered layer 20 is removed from the sidewall of the second opening 18, the altered layer 22 is simultaneously removed from the sidewall of the wiring groove 19, and the low-k film 27 is buried in the gap 26 of these sidewalls. Consequently, the k value of the low-k film will not be substantially increased between the wiring layers where the increase in the parasitic capacitance becomes the largest problem, and the capacitance between the wiring layers can be reduced. Further, it can be expected that the mechanical strength of the semiconductor device is improved because the altered layers 21 and 23 remains at the bottom portion of the wiring layer.

Further, a third embodiment for producing a dual damascene wiring layer, using a double-layer low-k film, will be described below. FIGS. 3A to 3H are sectional views showing steps of forming these wiring layers.

Figure 3A:
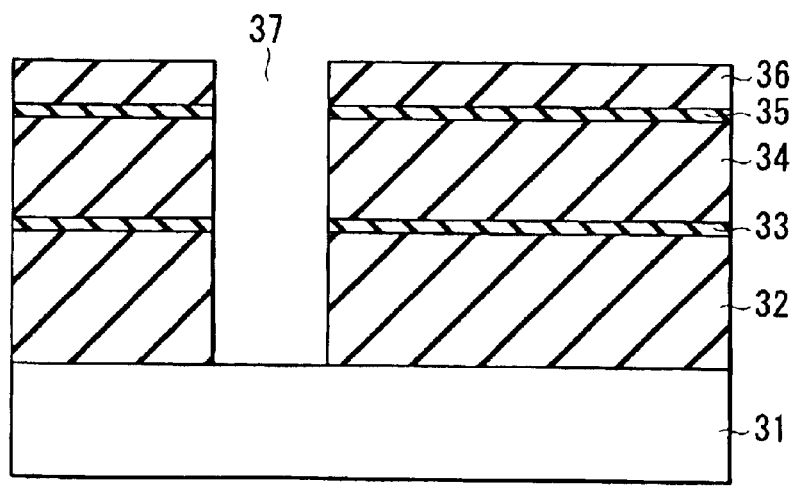
FIGS. 3A to 3H are sectional views showing a series of forming a dual damascene wiring layer according to a third embodiment.

First, as shown in FIG. 3A, a first low-k film 32 having a predetermined thickness, an insulating film 33 selected from one of an $SiO_2$ film, an SiN film, and an SiC film, and a second low-k film 34 are stacked on a silicon substrate 31 which includes a semiconductor element and a Cu wiring layer (not shown), and then a modified layer 35 is further formed on the second low-k film 34 in the same manner as the second embodiment. At this point, either the same materials or the different materials may be used for the first and second low-k films 32 and 34. After a first photoresist pattern 36 is formed on the modified layer 35, the modified layer 35, the second low-k film 34, the insulating film 33, and the first low-k film 32, are selectively removed by the RIE process so that the silicon substrate 31 is exposed, using the first photoresist pattern 36 as the mask, and then a first opening 37 is formed.

Figure 3B:
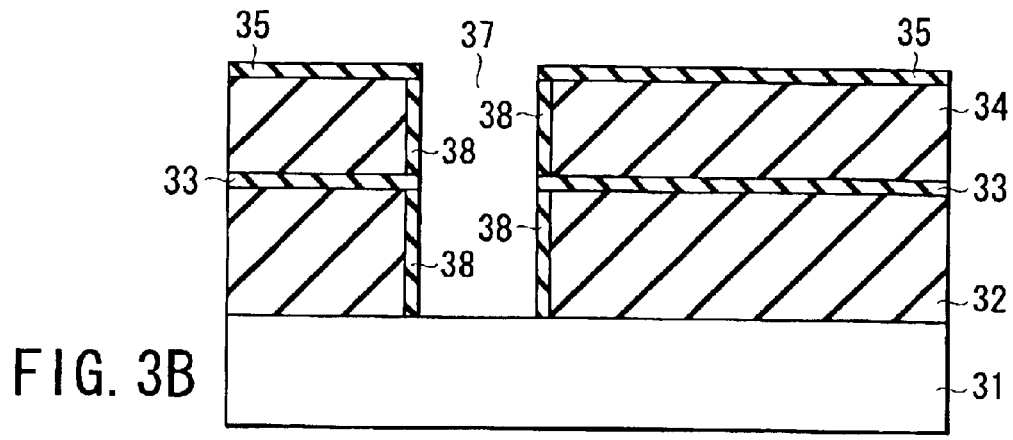

As shown in FIG. 3B, the first photoresist pattern 36 is removed by the ashing using the oxygen plasma processing. In the ashing processing, exposed parts of the first and second low-k films 32 and 34 are altered by the oxygen radical in the plasma and an altered layer 38 of the silicon oxide film is formed on the sidewall of the first opening 37.

Figure 3C:
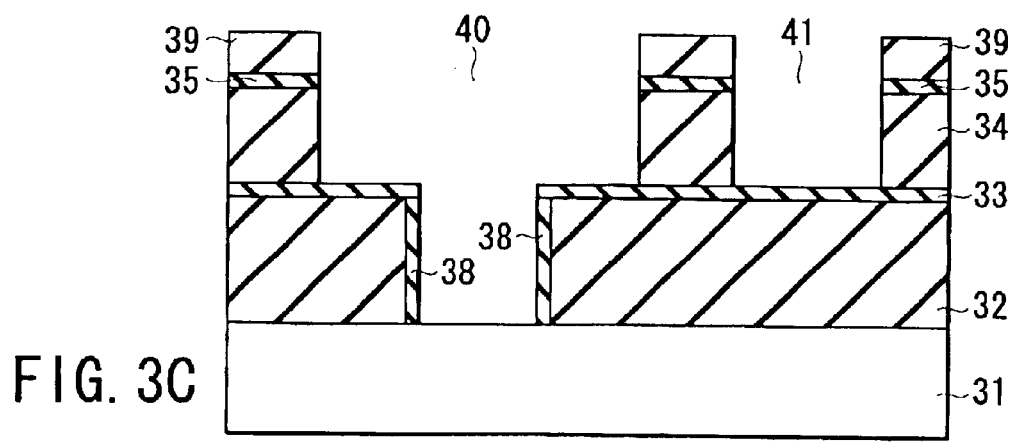

As shown in FIG. 3C, a second photoresist pattern 39 is formed on the residual modified layer 35 and the second low-k film 34 is selectively removed. As a result, a second opening 40, a part of which overlaps with the first opening 37 and which is larger than a width of the first opening 37, is formed in the second low-k film 34. At the same time, a wiring groove 41 for buried wiring layer close to the second opening 40 is formed in the second low-k film 34.

Figure 3D:
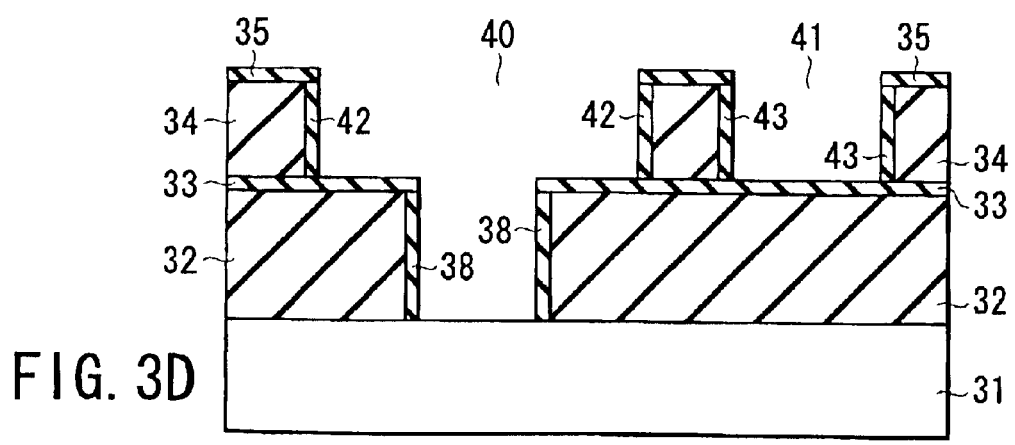

As shown in FIG. 3D, the second photoresist pattern 39 is removed by the same ashing processing. In the ashing processing, the exposed part of the second low-k film 34 is altered by the oxygen radical in the plasma and an altered layer 42 is formed on the sidewall of the second opening 40. An altered layer 43 is simultaneously formed on the sidewall of the wiring groove 41.

Figure 3E:
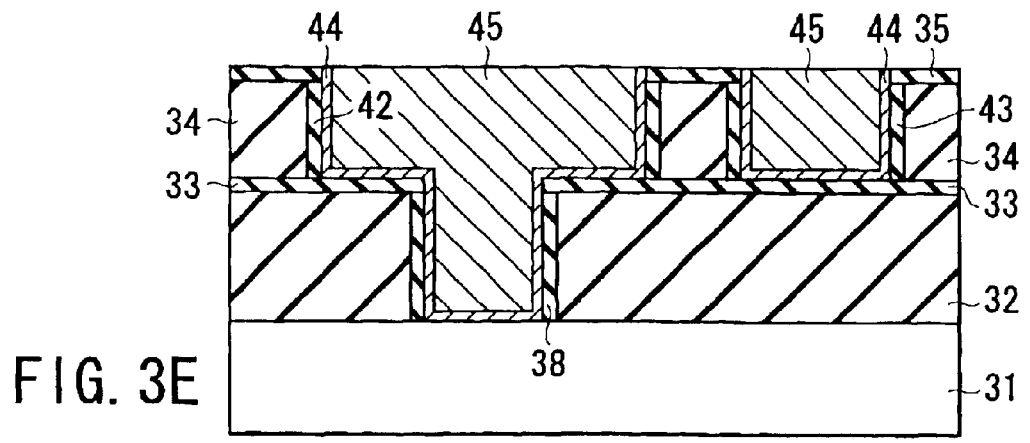

As shown in FIG. 3E, after a TaN film of a barrier metal film 44 and a Cu film of a Cu wiring layer 45 are deposited over the substrate surface so as to be buried in the first and second openings 37 and 40 and the wiring groove 41, the unnecessary TaN film and Cu film which are located outside the openings 37 and 40 and the wiring groove 41 are removed by the CMP process, thereby producing the barrier metal film 44 and the Cu wiring layer 45 buried in the openings 37 and 40 and the wiring groove 41 respectively.

Figure 3F:
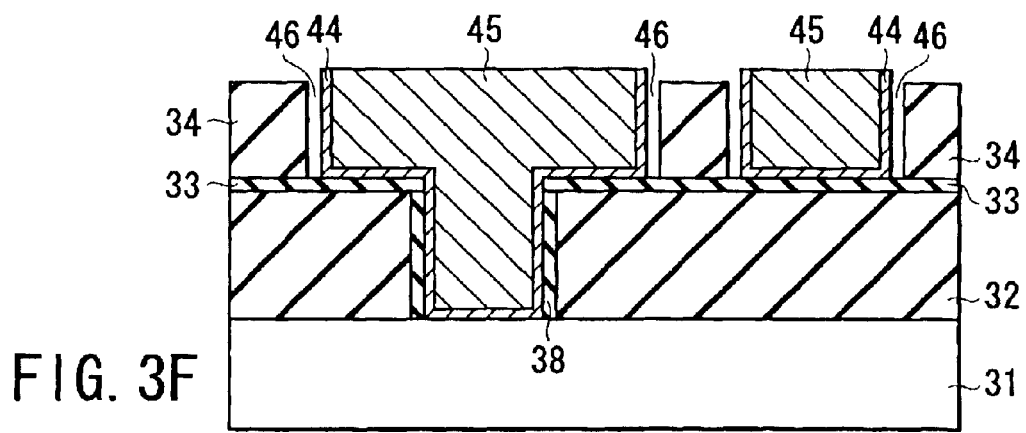

As shown in FIG. 3F, the modified layer 35, the altered layer 42 formed on the sidewall of the second opening 40, and the altered layer 43 formed on the sidewall of the wiring groove 41, which are the exposed silicon oxide film, are selectively removed by the wet processing to form a gap 46 between the upper portion of the barrier metal film 44 and the second low-k film 34. That is, the modified layer 35 and the altered layer 42 along the sidewall of the second opening 40 are removed by the wet processing. The altered layer 43 is simultaneously removed along the sidewall of the wiring groove 41. At this point, the insulating film 33 and the altered layer 38 of the first opening 37 remain at the lower portion of the barrier metal film 44 because the insulating film 33 acts a stopper.

Figure 3G:
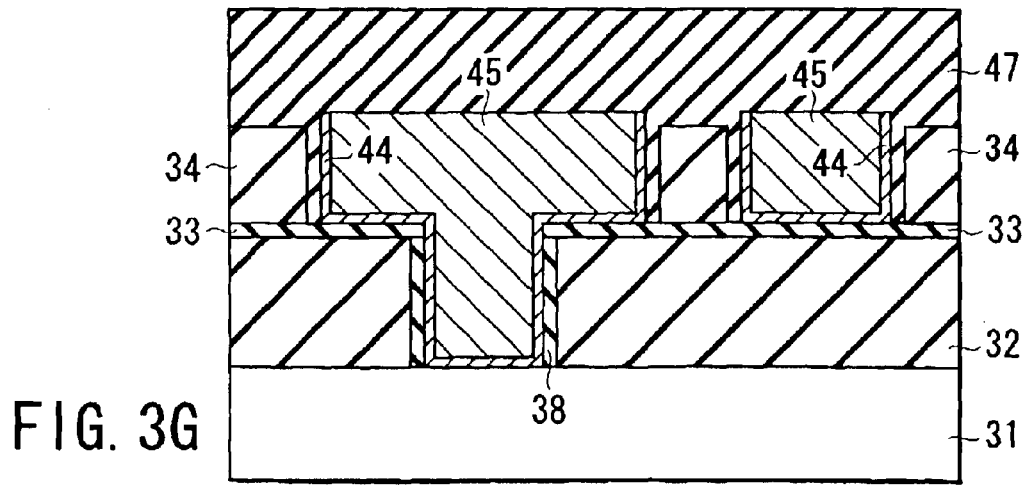
Figure 3H:
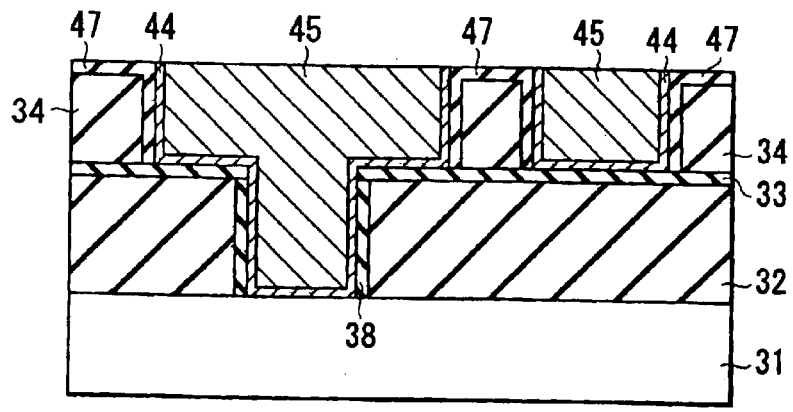
Figure 4A:
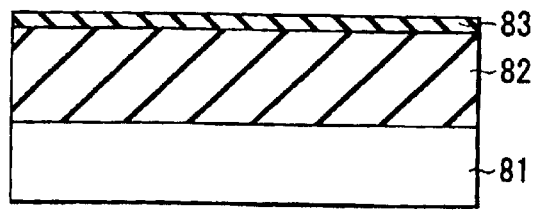
FIGS. 4A to 4C are sectional views showing a series of a damascene process of a prior art.
Figure 4B:
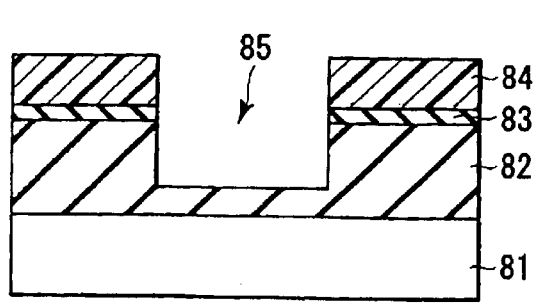
Figure 4C:
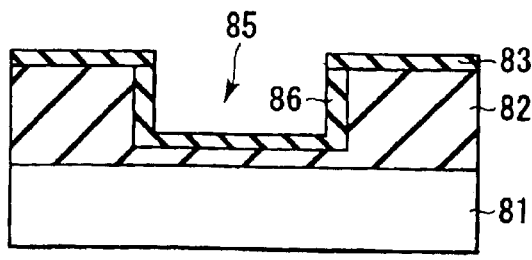

As shown in FIG. 3G, a third low-k film 47 is deposited over the substrate surface so as to be buried in the gaps 46 of the sidewalls in the second opening 40 and the wiring groove 41. The same material as that of the first low-k film 32 is used as the material of the third low-k film 47.

Finally, as shown in 3H, the third low-k film 47 is polished by the CMP process until the surface of the Cu wiring layer 45 is exposed, and the Cu damascene process is finished.

Even in the third embodiment, similarly to the second embodiment, the altered layers 42 and 43 are removed from the sidewalls of the second opening 40 and wiring groove 41, and the low-k film 47 is buried in the gaps 46 of those sidewalls. Therefore, the substantial k value of the low-k film will not be increased and the capacitance between the wiring layers can be reduced. Since the insulating film 33, which is selected from one of the $SiO_2$ film, the SiN film, and the SiC film, is formed on the first low-k film 32, the amount of etching can be easily controlled when the second opening 40 and the wiring groove 41 are formed, and when the altered layers 42 and 43 formed on the sidewalls of the second opening 40 and wiring groove 41 are removed. Further, even if the third low-k film 47 is polished by the CMP process, at least the first low-k film 32 will not be undesirably damaged.

The invention is not limited to the above-described embodiments. The case in which Cu is used as the wiring material has been described in the embodiments. However, the invention can be applied to the case in which other wiring materials such as Ag, Al, and W are used. One or more kinds of layers made of Ta, Ti, W, and Nb or the nitride of these elements except TaN may be formed as the barrier metal film. In these cases, chemicals used for the wet processing are properly changed such that the altered layer and the modified layer are selectively removed.

Though the case in which the altered layer remained over the bottom portion of the wiring groove has been described in the embodiments, the altered layer at the bottom portion of the wiring groove may be removed more or less in the wet processing.

Though the case in which the organic silicon oxide film is used as the low-k film has been described in the embodiments, other insulating films whose k value having 3.0 or less may be used. Concretely, examples thereof include an inorganic silicon oxide film such as hydrogen silsesquioxane or the CF series film such as polyalylene ether, parylene, and polyimide fluoropolymer.

Though the case in which the so-called buried wiring layer and the dual damascene wiring layer are formed has been described in the embodiments, it can be applied to the electrically conductive plug and the like. That is, the opening formed for the low dielectric constant insulating film may be at least one of a concave portion which does not pass through the low dielectric constant insulating film and a concave portion which passes through the low dielectric constant insulating film. For example, the wiring groove of the damascene wiring layer, a connecting hole in which the plug is buried, and the wiring groove and connecting hole of the dual damascene wiring can be given. In the case of the wiring groove and connecting hole with which the dual damascene wiring is communicated, the order of the opening is not particularly limited.

Though the modified layer is formed on the low-k film in the embodiments, it is not always required.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:

forming a first low dielectric constant insulating film over a semiconductor substrate;

forming a photoresist pattern on the first low dielectric constant insulating film;

etching the first low dielectric constant insulating film to form a concave portion therein, using the photoresist pattern;

burying a conductive film in the concave portion after the photoresist pattern is removed;

removing an altered layer formed on a sidewall of the concave portion of the first low dielectric constant insulating film after the conductive film is buried, the altered layer being formed when the photoresist pattern is removed; and forming a second low dielectric constant insulating film so as to fill a gap of the sidewall of the concave portion therewith, the gap resulting from removing the altered layer.

2. The method according to claim 1, wherein the conductive film includes a Cu film.

3. The method according to claim 1, wherein the conductive film includes a barrier metal film covering an inside surface of the concave portion and a Cu film filling an inside of the concave portion through the barrier metal film therewith.

4. The method according to claim 1, wherein the photoresist pattern is removed by ashing processing using oxygen plasma.

5. The method according to claim 1, wherein the altered layer is removed by wet processing.

6. The method according to claim 5, wherein the altered layer is removed by wet processing using hydrogen fluoride.

7. The method according to claim 1, wherein the first and second low dielectric constant insulating films are an organic silicon oxide film.

8. The method according to claim 1, wherein the first and second low dielectric constant insulating films are made of materials different from each other.

9. The method according to claim 1, wherein dielectric constant of the first and second low dielectric constant insulating films is 3.0 or less.

10. The method according to claim 1, further comprising forming a modified layer on a surface of the first low dielectric constant insulating film before the photoresist pattern is formed.

11. A method of manufacturing a semiconductor device, comprising:

forming a first low dielectric constant insulating film on a semiconductor substrate;

etching the first low dielectric constant insulating film so as to pass through the first low dielectric constant insulating film to form a first opening having a first opening width therein, using a first photoresist pattern;

removing the first photoresist pattern;

etching the first low dielectric constant insulating film to form a second opening therein, using a second photoresist pattern, the second opening having a second opening width larger than the first opening width and a depth shallower than that of the first opening;

removing the second photoresist pattern;

burying a conductive film in a concave portion in which the first and second openings are communicated with each other;

removing an altered layer formed on a sidewall of the second opening after the conductive film is buried, the altered layer being formed when the second photoresist pattern is removed; and forming a second low dielectric constant insulating film so as to fill a gap of the sidewall of the second opening therewith, the gap resulting from removing the altered layer.

12. The method according to claim 11, wherein the conductive film includes a barrier metal film covering inside surfaces of the first and second openings and a Cu film filling insides of the first and second openings through the barrier metal film therewith.

13. The method according to claim 11, wherein the first and second photoresist patterns are removed by ashing processing using oxygen plasma.

14. The method according to claim 11, wherein the altered layer is removed by wet processing.

15. The method according to claim 14, wherein the altered layer is removed by wet processing using hydrogen fluoride.

16. The method according to claim 11, wherein the first and second low dielectric constant insulating films are an organic silicon oxide film.

* * * * *